US006091643A

United States Patent [19]
Kawakami

[11] Patent Number: 6,091,643
[45] Date of Patent: Jul. 18, 2000

[54] SEMICONDUCTOR MEMORY DEVICE HAVING A NON-VOLATILE MEMORY CELL ARRAY

[75] Inventor: Yukitoshi Kawakami, Kawasaki, Japan

[73] Assignee: Fujitsu Limited, Kanagawa, Japan

[21] Appl. No.: 09/243,109

[22] Filed: Feb. 3, 1999

[30] Foreign Application Priority Data

Mar. 27, 1998 [JP] Japan .................................. 10-082301

[51] Int. Cl.[7] ...................................................... G11C 16/04

[52] U.S. Cl. ................................. 365/185.29; 365/185.11

[58] Field of Search ......................... 365/185.29, 185.21, 365/218, 189.09, 230.03, 185.11

[56] References Cited

U.S. PATENT DOCUMENTS 5,361,227 11/1994 Tanaka et al. ..................... 365/185.22

*Primary Examiner*—A. Zarabian
*Attorney, Agent, or Firm*—Armstrong, Westerman, Hattori, McLeland & Naughton

[57] ABSTRACT

A semiconductor memory includes a non-volatile memory cell, a writing circuit writing data into the non-volatile memory cell, an erasing circuit erasing data from the non-volatile memory cell, and a memory circuit holding the number of times of erasing data from the non-volatile memory cell.

7 Claims, 7 Drawing Sheets

ROW DEC
102
SEL1
SEL2
SELn
103
108
ERASE BLOCK SW
105
PUMP
106
PULSE CONTROL
107
SOURCE CONTROL
CONTROL CKT

SEMICONDUCTOR MEMORY DEVICE HAVING A NON-VOLATILE MEMORY CELL ARRAY

BACKGROUND OF THE INVENTION

The present invention generally relates to semiconductor devices and more particularly to a semiconductor memory device having a non-volatile memory cell array for storing data.

$E^2$PROMs (Electrically Erasable and Programmable ROM) are used extensively for a semiconductor memory device of microcomputers for storing programs.

An $E^2$PROM includes a non-volatile memory cell of the so-called FLOTOX (Floating Gate Tunnel Oxide) type or MNOS (Metal Nitride Oxide Semiconductor) type, wherein a FLOTOX type cell includes an electrically isolated floating gate and stores the logic data "0" or "1" in the form of electric charges.

It should be noted that such a writing of the data "0" or "1" into a memory cell is carried out by injecting or extracting electrons to or from the floating gate, wherein such an injection or extraction of the electrons is achieved by charging or discharging the floating gate by way of a tunnel current. It should be noted that the tunnel current is caused to flow by increasing the voltage applied to the floating gate.

In the state the floating gate is charged with electrons, the threshold voltage of the memory cell transistor is decreased. In the state the floating gate is discharged, on the other hand, the threshold voltage is increased. Thus, the memory cell produces a logic output indicative of the charging state of the floating gate as a result of the change of the threshold voltage.

FIG. 1 shows the block diagram of a conventional non-volatile semiconductor memory device 1.

Referring to FIG. 1, the semiconductor memory device 1 includes a non-volatile memory cell array 2, wherein the non-volatile memory cell array 2 includes a plurality of non-volatile memory cells therein. Further, there are provided a row decoder 3 in cooperation with the memory cell array 2 for selecting a row of the memory cell array 2 in response to a given address, a column decoder 4 selecting a column of the memory cell array 2 in response to a given address, a sense amplifier 5 in cooperation with the column decoder 4 for amplifying the data signal of the non-volatile memory cell that is selected by the row decoder 3 and the column decoder 4. The sense amplifier 5 is supplied with a reference signal from a reference cell 6 and there is provided an input/output buffer 7 for holding the output of the sense amplifier 5. The input/output buffer 7 further holds an external input data signal to be written into a selected memory cell.

In addition, there are provided an address buffer 8 supplied with external address data and for supplying the same to the row decoder 3 and to the column decoder 4, an erasing circuit 9 for flash-erasing the non-volatile memory cell array 2 when a rewriting of the data is to be made, a writing circuit 10 for writing data into the memory cell array 2, and a control circuit 11 for controlling the erasing circuit 9 and the writing circuit 10 when rewriting the data in the memory cell array 2.

FIG. 2 shows a typical conventional construction of the memory cell forming the memory cell array 2.

Referring to FIG. 2, the memory cell includes a memory cell transistor $Q_m$ and a select transistor $Q_s$, wherein the memory cell transistor $Q_m$ includes a floating gate Gf between a control gate $G_{cnt}$ and a channel defined in a semiconductor substrate in the state that the floating gate $G_f$ is isolated from the surroundings. The non-volatile memory cell thereby produces a logic output in response to the electric charges held in the floating gate $G_f$.

When reading data, a read address is supplied to an address terminal $T_{add}$ connected to the address buffer 8, wherein the address thus supplied is held in the address buffer 8 and is supplied further to the row decoder 3 and to the column decoder 4 from the address buffer 8. The row decoder 3 and the column decoder 4 thereby select the memory cell corresponding to the address given by the address buffer 8, wherein the memory cell thus selected is connected to the sense amplifier 5 via the column decoder 4.

In the sense amplifiers, the output signal of the selected memory cell is compared with a reference signal from the reference cell and is amplified according to the result of the comparison. The output signal thus amplified is then supplied to the input/output buffer 7. Thereby, the input/output buffer 7 holds the output signal thus supplied thereto and supplies the same further to an input/output terminal $T_{in\text{-}out}$. During this operation, a data-read control signal is supplied to a control terminal $T_{cnt}$, wherein the data-read control signal is supplied to a control circuit 11 via a control terminal $T_{cnt}$. It should be noted that control circuit 11 controls the data hold timing of the address buffer 8 and the input/output buffer 7 in response to the data read control signal.

When rewriting data, a data-rewrite control signal is supplied to the control terminal $T_{cnt}$, wherein the data rewrite control signal thus supplied to the control terminal $T_{cnt}$ is forwarded further to the control circuit 11. The control circuit 11 thereby controls the erase circuit 9 in response to the data-rewrite control signal.

FIG. 3 shows the block diagram of a conventional example of the erase circuit 9.

Referring to FIG. 3, the erase circuit 9 includes a pump circuit 12 for boosting the voltage of the control gate $G_{cnt}$ of the memory cell transistor $Q_m$ constituting the memory cell of the non-volatile memory cell array 2 to a level sufficient for erasing the electric charges of the floating gate $G_f$, a pulse control circuit 13 controlling the timing of operation of the pump circuit 12, an erase block switch 14 selectively supplying the boosted voltage of the pump circuit 12 to the control gate $G_{cnt}$ of the memory cell transistor $Q_m$ of a selected block, from which the data is to be erased, and a gate voltage control circuit 15 controlling the gate voltage of the memory cell constituting the non-volatile memory cell array 2.

It should be noted that the erase circuit 9 carries out the erasing of data in each of the blocks by supplying the boosted erase voltage to each of the erasing blocks of the non-volatile memory cell array 2. Further, the control circuit 11 controls the writing circuit 10, after the completion of the erasing by the erase circuit 9, and carries out writing of the data supplied to the input/output buffer 7 into the non-volatile memory cell array in correspondence to the address data held by the address buffer 8.

On the other hand, such conventional non-volatile semiconductor memory devices have lacked the function of controlling or managing the number of the erasing operations or erase number conducted on the semiconductor memory device. Because of this, it was not possible for the user or designer of the non-volatile semiconductor memory device to recognize the actual number of erasing operations conducted on a given non-volatile semiconductor memory device. As a consequence, it was not possible to recognize the state of degradation even when a given non-volatile semiconductor device in use or a defective non-volatile semiconductor device is given for inspection.

SUMMARY OF THE INVENTION

Accordingly, it is a general object of the present invention to provide a novel and useful non-volatile semiconductor memory wherein the foregoing problems are eliminated.

Another and more specific object of the present invention is to provide a non-volatile semiconductor memory enabling a recognition of the number of erasing operations by a simple construction.

Another object of the present invention is to provide a semiconductor memory, comprising:

- a non-volatile memory cell;
- a writing circuit writing data into said non-volatile memory cell;
- an erasing circuit erasing data from said non-volatile memory cell; and
- a memory circuit holding the number of times of erasing data from the non-volatile memory cell.

According to the present invention, the state of degradation of the non-volatile semiconductor memory device is easily recognized by reading out data from the memory circuit of the non-volatile semiconductor memory device.

Other objects and further features of the present invention will become apparent from the following detailed description when read in conjunction with the attached drawings.

DETAILED DESCRIPTION OF THE PREFERRED EMBODIMENT

Figure 4:
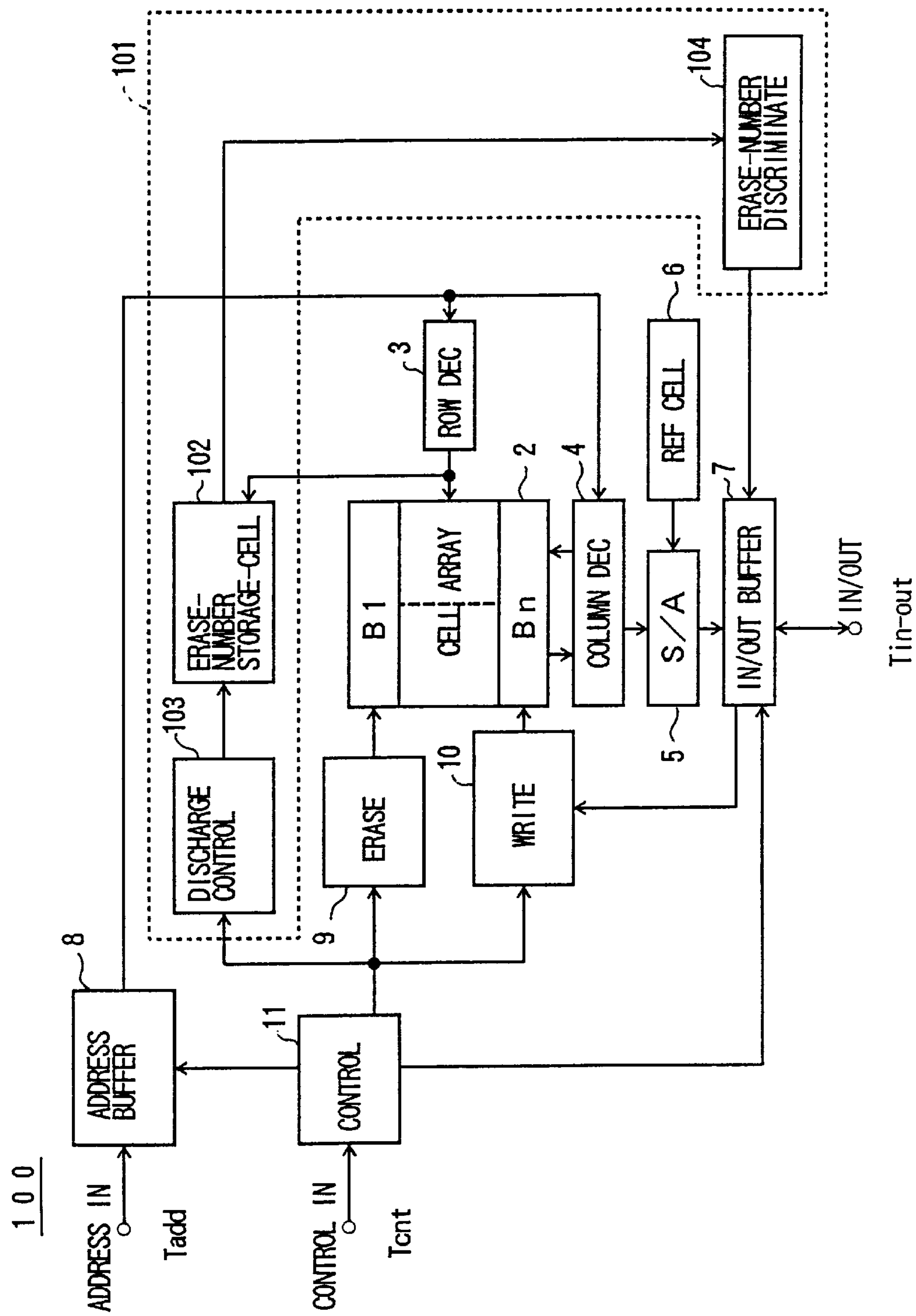
FIG. 4 is a block diagram showing the construction of a non-volatile semiconductor memory device according to an embodiment of the present invention.

FIG. 4 is a block diagram showing the construction of a non-volatile semiconductor memory device 100 according to an embodiment of the present invention, wherein those parts corresponding to the parts described previously are designated by the same reference numerals and the description thereof will be omitted.

Figure 1:
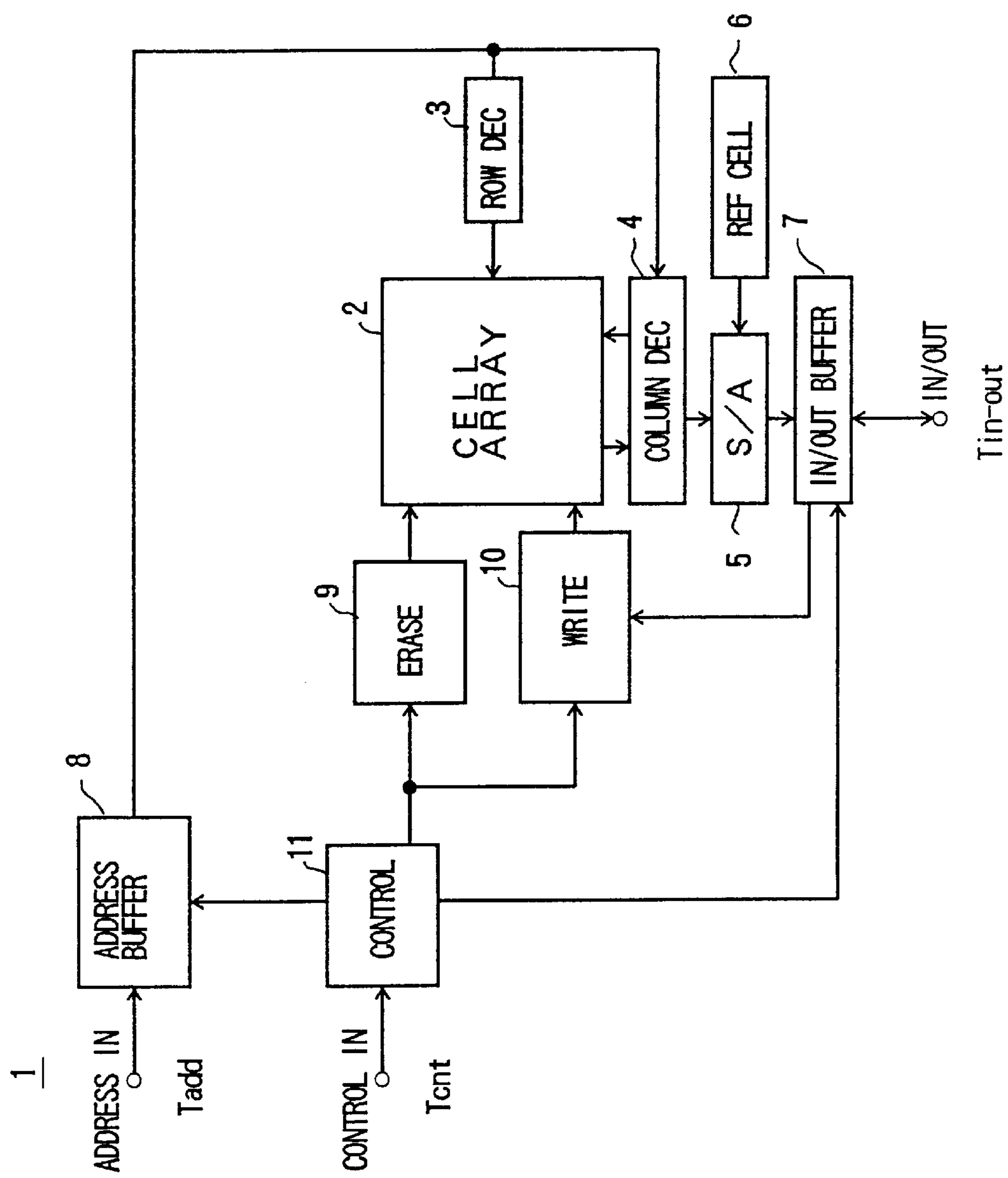
FIG. 1 is a block diagram showing the construction of a conventional non-volatile semiconductor memory device.

Referring to FIG. 4, the non-volatile semiconductor memory device 100 includes, in addition to the conventional non-volatile semiconductor memory device 1 of FIG. 1, an erase-number detection circuit 101 for detecting the number of erasing operations, or erase number, conducted on the memory cell array 2.

Figure 5:
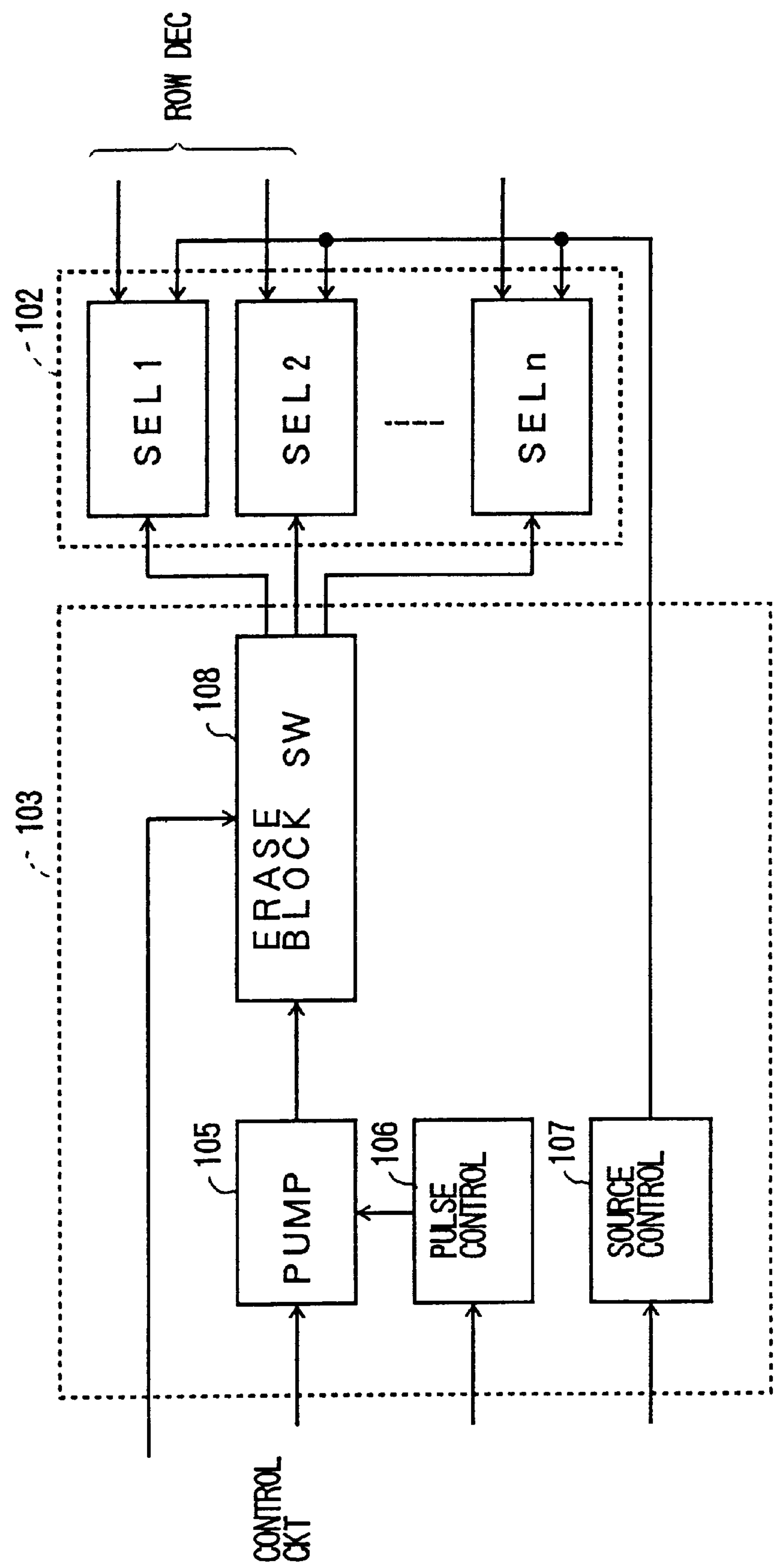
FIG. 5 is a block diagram showing the construction of a discharge control circuit used in the non-volatile semiconductor memory device of FIG. 4.

FIG. 5 shows the construction of the erase-number detection circuit 101.

Referring to FIG. 5, the erase-number detection circuit 101 includes an erase-number memory cell 102 in which discharging of a minute amount of electric charges occurs in response to each of the erasing operations conducted on the non-volatile semiconductor memory cell array 2, a discharge control circuit 103 for discharging the electric charges held by the erase-number memory cell 102, and an erase-number discrimination circuit 104 detecting the erase-number from a cell voltage $V_{th}$ indicative of the electric charges held in the erase-number memory cell 102.

FIG. 5 shows the construction of the discharge control circuit 103 used in the non-volatile semiconductor memory device 100 of FIG. 4, wherein those parts corresponding to the parts described previously are designated by the same reference numerals and the description thereof will be omitted.

Figure 3:
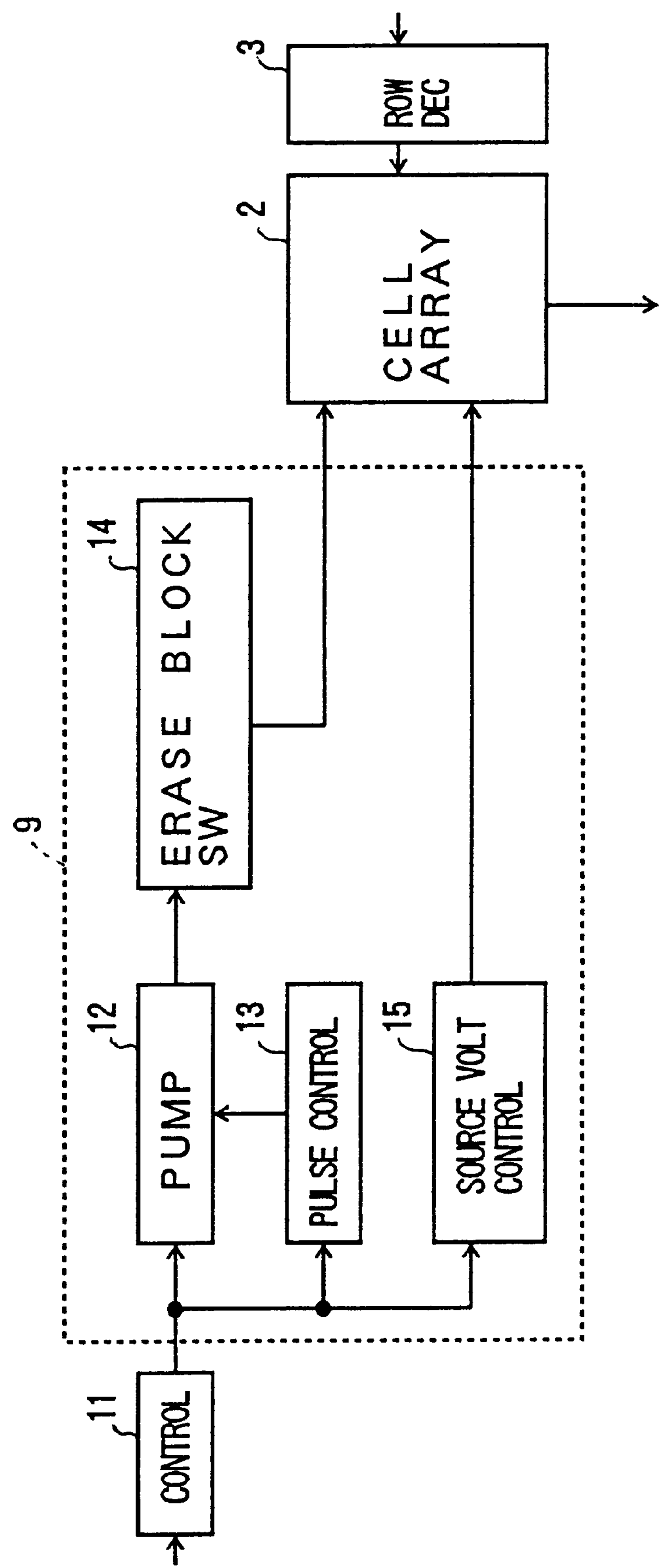
FIG. 3 is a block diagram showing the construction of a conventional erasing circuit.

Referring to FIG. 5, the discharge control circuit 103 has a construction generally identical with the construction of the erasing circuit 9 of FIG. 3 and applies a boosted erase voltage to the erase-number memory cell 102, wherein the erase-number memory cell 102 actually includes memory cells $SEL_1$–$SEL_n$ in correspondence to the blocks $B_1$ –$B_n$ defined in the memory cell array 2. It should be noted that each of the memory cells $SEL_1$ –$SEL_n$ has a construction substantially identical with the construction of the non-volatile memory cell constituting the memory cell array 2 and stores therein the erase-number or number of the erasing operations in the form of electric charges.

Figure 6:
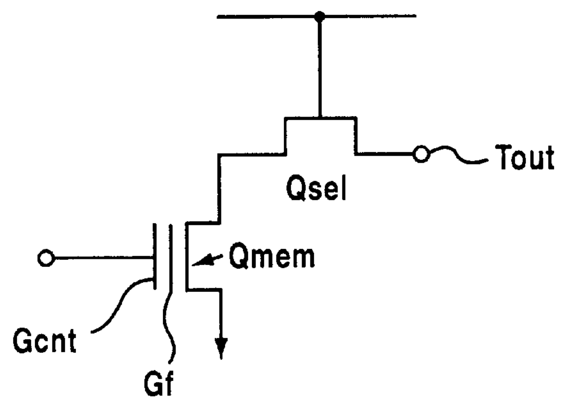
FIG. 6 is a block diagram showing the construction of an erase-number memory cell used for storing the erase-number in the embodiment of FIG. 4.

FIG. 6 shows the construction of any of the erase-number memory cells $SEL_1$–$SEL_n$ of FIG. 5.

Figure 2:
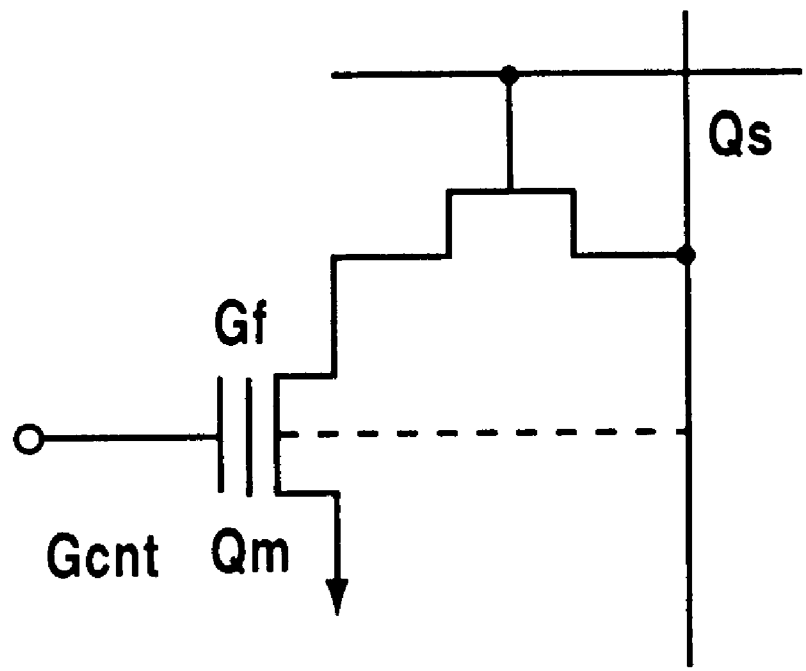
FIG. 2 is a circuit diagram showing the construction of a conventional non-volatile memory cell.

Referring to FIG. 6, the erase-number memory cell includes a memory cell transistor $Q_{mem}$ and a selection transistor $Q_{sel}$ similarly to the memory cell of FIG. 2 constituting the non-volatile memory cell array 2, wherein the memory cell transistor $Q_{mem}$ includes a floating gate $G_f$ between a control gate $G_{cnt}$ and the channel region of the transistor $Q_{mem}$. The floating gate $G_f$ is thereby used for storing a predetermined amount of initial electric charges, and a minute amount of electric charges are discharged from the floating gate $G_f$ each time data is erased in the block.

During this discharging operation, a gate voltage boosted sufficiently for discharging the floating gate $G_f$ is applied from the discharge control circuit 102 to the control gate $G_{cnt}$ of the memory cell transistor $Q_{mem}$, and an erasing source voltage is applied further to the source of the memory cell transistor $Q_{mem}$ from the discharge control circuit 102.

It should be noted that the discharge control circuit 102 includes: a pump circuit 105 for boosting the gate voltage to be supplied to the control gate $G_{cnt}$ of the discharge control circuit 103 to a voltage level sufficient for causing the discharging of the electric charges from the floating gate $G_f$; a pulse control circuit 106 for controlling the duration of the gate voltage supplied from the pump circuit 15 to the control gate $G_{cnt}$ of the memory cell transistor $Q_{mem}$; a source voltage control circuit 107 for controlling the source voltage of the memory cell transistor $Q_{mem}$; and an erase block switch 108 for selecting one of the erase-number memory cells $SEL_1$–$SEL_n$ of the non-volatile memory cell array 2 from which the data is to be erased.

The pump circuit 105 thereby supplies the control signal, which is supplied thereto from the control circuit 11 in the erasing mode of the non-volatile semiconductor memory device 100, to the erase block switch 108 with a boosting thereof to the level of about 20 volts. The erase block switch 108, on the other hand, supplies the boosted voltage of the pump circuit 105 to the control gate $G_{cnt}$ of the memory cell transistor $Q_{mem}$ of any of the erase-number memory cells $SEL_1$–$SEL_n$ corresponding to the block of the non-volatile memory cell array 2, from which the information is to be erased, in response to the control signal supplied from the control circuit 11.

It should be noted that the pulse control circuit 106 produces the control pulse with a duration of typically about 1 μsec, which is substantially smaller than the duration normally used for erasing the non-volatile memory cell array 2. Thereby, only a fraction of the electric charges held in the selected erase-number memory cell $SEL_1$–$SEL_n$ are discharged in response to each control pulse, and the amount of the electric charges is reduced gradually with the control pulses.

Figure 7:
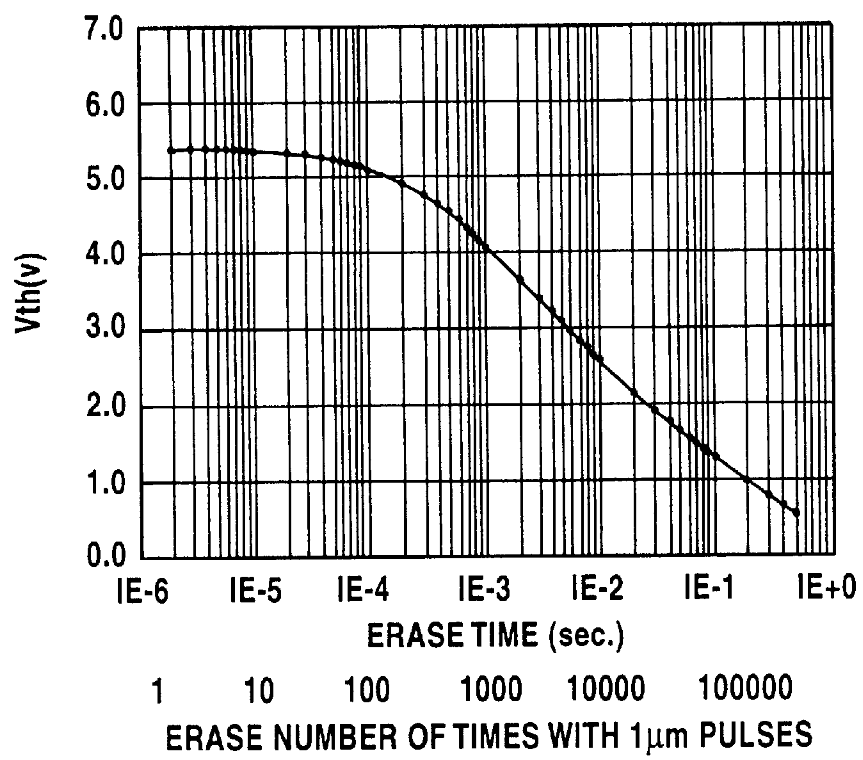
FIG. 7 is a block diagram showing the voltage retention characteristic of the memory cell of FIG. 6.

FIG. 7 shows the cell voltage $V_{th}$ held in the erase-number memory cell of FIG. 6 as a function of the erase number for the case in which the duration of erasing, caused in response to a single control pulse of the pulse control circuit 106, is set to 1 μsec.

Referring to FIG. 7, the cell voltage $V_{th}$ decreases with the erase number or the number of times the erasing process is made, indicating that it becomes possible to detect the erase number by using the relationship of FIG. 7.

Thus, when one of the erase-number memory cells $SEL_1$–$SEL_n$ is selected in response to a given address, the select transistor $Q_{sel}$ of the selected erase-number memory cell is turned ON, and the voltage signal $V_{th}$ indicative of the electric charges held in the floating gate $G_f$ of the memory cell transistor $Q_{mem}$ of the selected erase-number memory cell is forwarded to the erase-number discrimination circuit 104 via the output terminal $T_{out}$ of the select transistor $Q_{sel}$. Thereby, the erase-number discrimination circuit 104 discriminates the erase number based on the foregoing voltage signal $V_{th}$ corresponding to the electric charges held in the floating gate $G_f$ of the selected erase-number memory cell.

Figure 8:
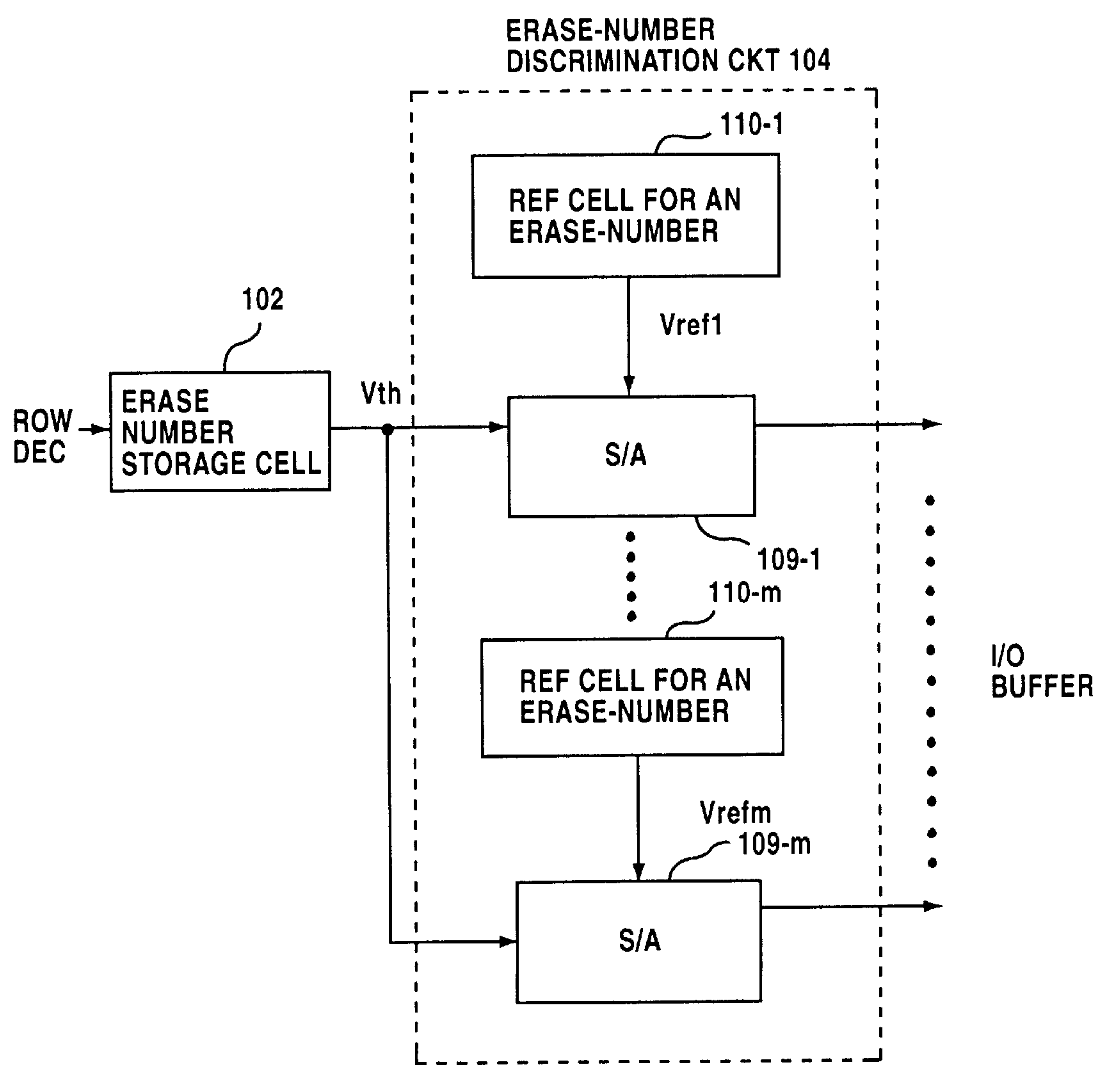
FIG. 8 is a block diagram showing an erase-number discrimination circuit used in the embodiment of FIG. 4 for detecting the erase number.

FIG. 8 shows the block diagram of the erase-number discrimination circuit 104 used in the embodiment of FIG. 4.

Referring to FIG. 8, the erase-number discrimination circuit 104 includes sense amplifiers $\mathbf{109}_1$–$\mathbf{109}_m$ each having a construction substantially identical with the construction of the conventional sense amplifier 5 and reference cells $\mathbf{110}_1$–$\mathbf{110}_m$ provided in correspondence to the sense amplifiers $\mathbf{109}_1$–$\mathbf{109}_m$, wherein the reference cells $\mathbf{110}_1$–$\mathbf{110}_m$ provide respective reference voltages $V_{ref1}$–$V_{refm}$ to the corresponding sense amplifiers $\mathbf{109}_1$–$\mathbf{109}_m$ .

It should be noted that the reference cell $\mathbf{110}_1$ provides the foregoing reference voltage $V_{ref1}$ with a level equal to the foregoing voltage signal for the case in which the erasing of the memory cell transistor $Q_{mem}$ is repeated 100 times. Similarly, the reference cell $\mathbf{110}_2$ provides the foregoing reference voltage $V_{ref2}$ with a level equal to the reference voltage $V_{ref2}$ for the case in which the erasing of the memory cell transistor $Q_{mem}$ is repeated 100 times.

Further, the reference cell $\mathbf{110}_m$ provides the foregoing reference voltage $V_{refm}$ with a level equal to the reference voltage $V_{refm}$ for the case in which the erasing of the memory cell transistor $Q_{mem}$ is repeated 100 times.

Each of the reference cells $\mathbf{110}_1$–$\mathbf{110}_m$ has a construction identical with the construction of the conventional reference cell 6 of FIG. 1 and provides the voltage signal in correspondence to a predetermined erase number as noted above.

Further, each of the sense amplifiers $\mathbf{109}_1$–$\mathbf{109}_m$ produces a high level output or a low level output in response to the relationship between the cell voltage $V_{th}$ of any of the erase-number memory cells $SEL_1$–$SEL_m$ and the reference voltage selected from the voltages $V_{ref1}$–$V_{refm}$. For example, when all the sense amplifiers $\mathbf{109}_1$–$\mathbf{109}_m$ produce a logic output "0," this means that the cell voltage $V_{th}$ is still above the reference voltage $V_{ref1}$, which may correspond to the erasing repeated one hundred times, for all the erase-number memory cells $SEL_1$–$SEL_n$ and that the erase number is smaller than one hundred times.

When, on the other hand, the sense amplifiers $\mathbf{109}_1$–$\mathbf{109}_m$ produce the logic outputs "100 . . . 000," this means that the cell voltage $V_{th}$ is larger than the foregoing reference voltage $V_{ref1}$ corresponding to the erasing repeated one-hundred times but lower the reference voltage $V_{ref2}$ corresponding to the erasing repeated one-thousand times. Thus, the erase number is identified to be larger than 100 times but smaller than 1000 times. Similarly, when all the sense amplifiers $\mathbf{109}_1$–$\mathbf{109}_m$ produce the logic outputs "111 . . . 111," this means that the cell voltage $V_{th}$ is lower than the reference voltage $V_{refm}$ corresponding to one-million times erasing for all the erase-number memory cells $SEL_1$–$SEL_n$. In other words, the erase number has reached one-million times in this case.

It should be noted that the outputs of the sense amplifiers $\mathbf{109}_1$–$\mathbf{109}_m$ are held by the input/output buffer 7 for external output, and thus, it becomes possible to recognize the erase number of the non-volatile semiconductor memory device 100 based on the output signal on the output terminal $T_{in\text{-}out}$ connected to the input/output buffer 7.

In the construction of the semiconductor device 100 described heretofore, it should be noted that the discharge control circuit 103 can be easily configured by using the known construction of erase circuit 9. Similarly, the erase-number memory cell 102 is easily configured by using the known construction of non-volatile cell array 2. Further, the erase-number discrimination circuit 104 can be easily configured by using the known construction of sense amplifier 5 and reference cell 6. Thus, it is not necessary to newly design these circuits that are pertinent to the non-volatile semiconductor memory device 100 of the present invention.

Further, the present invention is by no means limited to the embodiments described heretofore, but various variations and modifications may be made without departing from the scope of the present invention.

The present application is based on Japanese priority application No. 10-82301 filed on Mar. 27, 1998, the entire contents of which are hereby incorporated by reference.

What is claimed is:

1. A semiconductor memory, comprising:

a non-volatile memory cell array;

a writing circuit writing data into said non-volatile memory cell array;

an erasing circuit erasing data from said non-volatile memory cell array; and a storage unit holding data indicative of the number of times erasing of data has been made in said non-volatile memory cell array, said storage unit including a storage cell holding a predetermined amount of initial electric charges, said storage cell experiencing a discharging each time said erasing of data occurs in said non-volatile memory cell array, and an erase-number recognition circuit recognizing said number of times of erasing data based on said electric charges remaining in said storage cell.

2. A semiconductor memory as claimed in claim 1, wherein said erase-number recognition circuit holds a threshold, said erase-number recognition circuit thereby recognizing said number of times of erasing data by comparing a signal indicative of said electric charges remaining in said storage cell with said threshold.

3. A semiconductor memory as claimed in claim 2, wherein said erase-number recognition circuit hold a plurality of thresholds.

4. A semiconductor memory as claimed in claim 1, wherein said non-volatile memory cell array includes a plurality of blocks, and wherein said storage cell is provided in correspondence to each of said blocks.

5. A semiconductor memory as claimed in claim 2, wherein said erase-number recognition circuit includes a threshold circuit producing a threshold voltage corresponding to an erase number as said threshold, and a comparison circuit comparing said signal with said threshold voltage.

6. A semiconductor memory as claimed in claim 5, wherein said storage cell has a construction substantially identical with a non-volatile memory cell forming said non-volatile memory cell array, and wherein said comparison circuit comprises a sense amplifier having a construction substantially identical with a sense amplifier used reading data from said non-volatile memory cell array.

7. A semiconductor memory as claimed in claim 6, wherein said erasing circuit further includes a pulse control circuit activating an electric discharge in said storage cell in response to erasing of said non-volatile memory cell array, said erasing circuit thereby activating said electric discharge for a duration substantially shorter than a duration of erasing said non-volatile memory cell array.

* * * * *